United States Patent [19]
Choi

[11] Patent Number: 5,347,142
[45] Date of Patent: Sep. 13, 1994

[54] MODES OF INFRARED HOT ELECTRON TRANSISTOR OPERATION IN INFRARED DETECTION

[75] Inventor: Kwong-Kit Choi, Tinton Falls, N.J.

[73] Assignee: The United States of America as represented by the Secretary of the Army, Washington, D.C.

[21] Appl. No.: 82,316

[22] Filed: Jun. 25, 1993

[51] Int. Cl.$^5$ ...................... H01L 27/14; H01L 31/00
[52] U.S. Cl. ...................... 257/29; 257/462; 250/338.4; 307/311
[58] Field of Search ............... 250/338.4; 257/29, 462; 307/311

[56] References Cited

U.S. PATENT DOCUMENTS

| | | | |
|---|---|---|---|
| 4,010,486 | 3/1977 | Suzuki | 257/462 |
| 4,862,238 | 8/1989 | Shannon | 257/29 |
| 4,873,555 | 10/1989 | Coon et al. | 207/14 |
| 4,894,526 | 1/1990 | Bethea et al. | 257/15 |
| 5,013,918 | 5/1991 | Choi | 257/184 |
| 5,031,013 | 7/1991 | Choi | 257/187 |

OTHER PUBLICATIONS

K. Choi, "10 Micrometer infrared hot-electron transistors", Applied Physics Letters, vol. 57, (1990), pp. 1348–1350.

Primary Examiner—Rolf Hille
Assistant Examiner—Minhloan Tran
Attorney, Agent, or Firm—Michael Zelenka; William H. Anderson

[57] ABSTRACT

A circuit incorporating an infrared hot electron transistor having a common base and biasing voltages. In one embodiment, the circuit is configured to take advantage of the photovoltage amplification capabilities of the infrared hot electron transistor. In another embodiment, the infrared hot electron transistor is configured to take advantage of the photovoltaic mode of operation of the infrared hot electron transistor. The present invention can therefore be used to directly replace a photodiode used in infrared detection. The present invention additionally provides an amplified output voltage and permits direct DC coupling to a high gain operational amplifier.

4 Claims, 1 Drawing Sheet

MODES OF INFRARED HOT ELECTRON TRANSISTOR OPERATION IN INFRARED DETECTION

GOVERNMENT INTEREST

The invention described herein may be manufactured, used, and licensed by or for the government for governmental purposes without the payment to me of any royalty thereon.

FIELD OF THE INVENTION

The present invention relates generally to infrared detection, and more specifically to electronic circuits incorporating an infrared hot electron transistor.

BACKGROUND OF THE INVENTION

Infrared devices are used in many practical applications, such as communications, security systems and other modern electronic devices. One of these infrared devices is disclosed in U.S. Pat. No. 5,013,918 entitled "Multicolor Infrared Photodetector" issuing to Choi on May 7, 1991, which is herein incorporated by reference. Yet another infrared device is disclosed in the article "10 μM infrared hot-electron transistors", Applied Physics Letters, Vol. 57(1990) pg. 1348–1350.

Many of the infrared detection devices use a photoconductor or photodiode to detect infrared radiation. While photoconductors work in many applications, the desired signal is often relatively low or limited in amplitude. Additionally, it is difficult to directly connect a photoconductor to a high gain amplifier. The typical application of a photoconductor in infrared detection requires a biasing voltage to be applied on the photoconductor. This applied bias prevents the photo signal from being directly coupled to a high gain amplifier, since the applied bias will saturate the amplifier output. The usual technique for using a photoconductor in light detection is the modulation of light intensity using a light chopper and AC coupling of the photo signal to the high gain amplifier. However, this results in a relatively complicated electrical system.

Therefore, there is a need for an electrical circuit that will be relatively simple and provide a more desirable output signal upon detection of infrared radiation.

SUMMARY OF THE INVENTION

The present invention comprises an electronic circuit utilizing an infrared hot electron transistor for detecting infrared radiation. In one embodiment of the invention, the infrared hot electron transistor has a common base and the photovoltage amplification capability of the infrared hot electron transistor is utilized. In a second embodiment of the present invention, the infrared hot electron transistor has a common base and is directly coupled to a high gain amplifier to take advantage of the photovoltaic mode of operation of the infrared hot electron transistor.

Accordingly, it is an object of the present invention to provide a circuit for infrared light detection.

It is an advantage of the present invention that it can replace a photodiode infrared detector.

It is a feature of the present invention that in one embodiment the photovoltage amplification capability of an infrared hot electron transistor is utilized.

It is yet another feature of the present invention that in a second embodiment the photovoltaic mode of operation is utilized.

These and other objects, advantages, and features will become readily apparent in view of the following more detailed described.

DETAILED DESCRIPTION OF THE PREFERRED EMBODIMENTS

Figure 1:
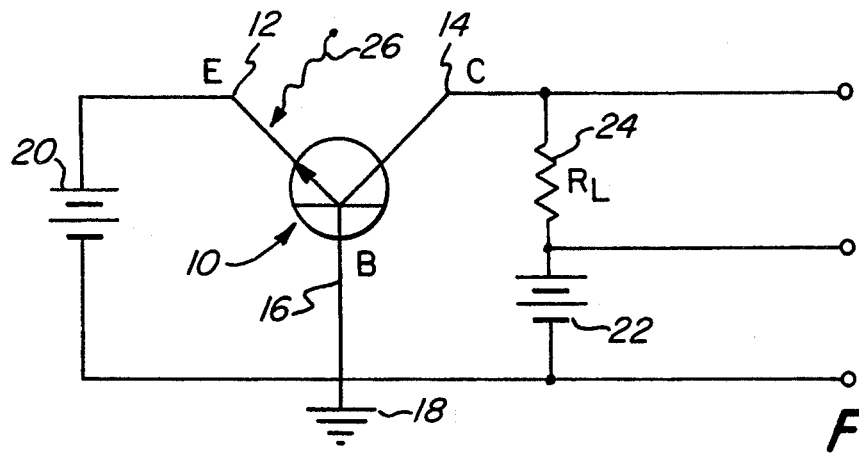
FIG. 1 is a schematic diagram of one embodiment of the present invention.

FIG. 1 is a schematic diagram illustrating the present invention. An infrared hot electron transistor 10 has an emitter 12, collector 14, and base 16. The base 16 is common and connected to ground 18. Between the emitter 12 and the base 16 is connected an emitter voltage supply 20. Between the collector 14 and base 16 is connected a collector voltage supply 22 and a load resistance 24. Load resistance 24 and collector voltage supply 22 are in series. The infrared hot electron transistor 10 is biased in a common-base configuration. When the infrared radiation represented by wavy arrow 26 striking the infrared hot electron transistor 10, a photovoltage appears between the emitter 12 and the base 16. This induces a voltage to appear at the collector 14. As a result, an amplified output voltage is obtained. This amplified output voltage is advantageous in aiding detection of infrared radiation.

Figure 2:
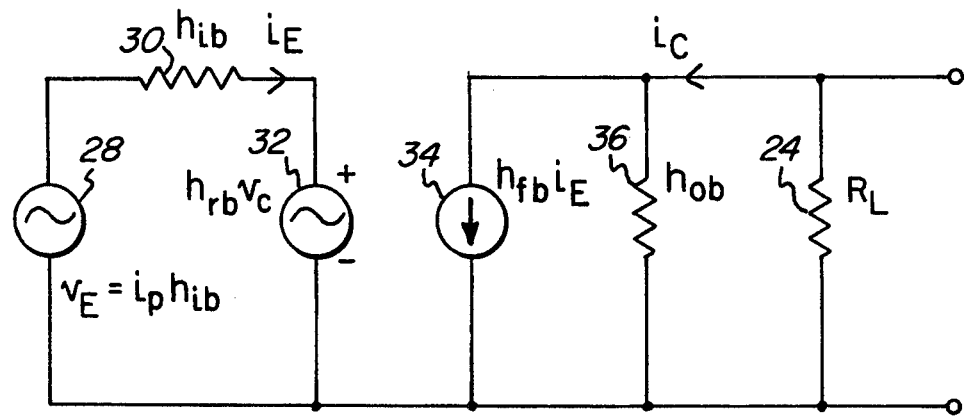
FIG. 2 is a schematic diagram of the equivalent circuit for the circuit illustrated in FIG. 1.

The operation of the circuit illustrated in FIG. 1 of the present invention can better be understood with reference to the equivalent circuit illustrated in FIG. 2. In FIG. 2, there is illustrated a voltage source 28 connected to a resistor 30 and another voltage source 32. Additionally illustrated is a current source 34, a resistor 36 and a load resistor 24. Using standard H-parameter notations for transistors, the circuit illustrated in FIG. 1 can be analyzed as follows with reference to the equivalent circuit illustrated in FIG. 2.

$$V_E = h_{ib} i_E + h_{rb} V_c$$

$$i_c = h_{fb} i_E + h_{ob} V_c$$

where $i_E$ is the emitter current, $h_{rb}$ is the common-base reverse voltage transfer ratio, and $h_{ob}$ is the common-base output admittance.

When infrared radiation is detected, there is a photovoltage between the emitter and the base given by, $$V_E = i_p h_{ib}$$

where $h_{ib}$ is the internal resistance of the photoconductor between the emitter and base, and $i_p$ is the photocurrent.

Using standard transistor theory, the photovoltage at the collector is, $$V_c = i_p h_{ib} h_{fb} \frac{R_L}{R_i}$$

where $h_{fb}$ is the photocurrent transfer ratio, and where, $$R_i = \frac{R_L \Delta^h + h_{ib}}{1 + h_{ob}R_L}$$

and $$\Delta^h = h_{ib}h_{ob} - h_{fb}h_{rb}$$

Typically, $$R_L < h_{ob}$$

and $$R_L \Delta^h < h_{ib}$$

Resulting in, $$R_i = h_{ib} = r$$

Therefore, $$V_c = i_p r h_{fb} \frac{R_L}{r}$$

Renaming, $$h_{fb} = \alpha$$

Then, $$V_c = i_p r \alpha \frac{R_L}{r}$$

Note that if, $$\alpha \frac{R_L}{r} > 1$$

Then, $$V_c > i_p r$$

The photovoltage gain is given by, $$A_v = \frac{V_{ctransistor}}{V_{pconductor}}$$
$$= i_p r \alpha \frac{R_L}{r} \frac{1}{i_p} \left( \frac{1}{r} + \frac{1}{R_L} \right)$$
$$= \alpha \left( 1 + \frac{R_L}{r} \right)$$

Therefore, by selecting, $$\frac{R_L}{r} > \left( \frac{1}{\alpha} - 1 \right)$$

an amplified output voltage can be obtained compared with a photoconductor when using the same value of $R_L$.

Figure 3:
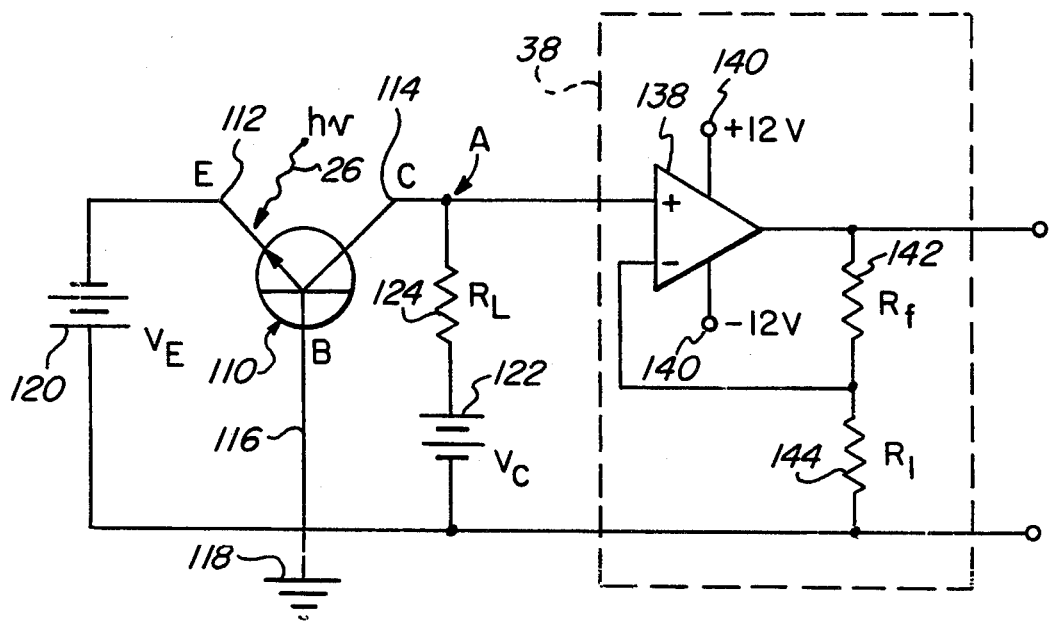
FIG. 3 is a schematic diagram illustrating a second embodiment of the present invention.

FIG. 3 illustrates a second embodiment of the present invention. In this embodiment, the photovoltaic mode of operation of the transistor 110 is utilized. Infrared hot electron transistor 110 has an emitter 112, collector 114, and base 116. The base 116 is common with ground 118. Connected between the emitter 112 and the base 116 is an emitter voltage supply 120. Connected in series between the collector 114 and the base 116 is a collector voltage supply 122 and a load resistor 124. Connected between the collector 114 and the base 116 in parallel with load resistor 124 and collector voltage supply 122 is a non-inverting constant gain multiplier 38. The non-inverting constant gain multiplier 38 is comprised of a high gain operational amplifier 138 having voltage supply terminals 140 and a feedback resistor 142 and another resistor 144. The non-inverting constant gain multiplier 38 provides an amplified signal of the voltage at point A at the collector 114 of infrared hot electron transistor 110. Therefore, the high gain operational amplifier is directly coupled to the infrared hot electron transistor 10.

In operation, the second embodiment illustrated in FIG. 3 has a potential at point A. The potential at point A can be adjusted by changing the collector voltage supply 122. The collector voltage supply 122 is adjusted so that the potential difference between ground 118 and point A is zero when there is no infrared light 26 signal to be detected. Therefore, when an infrared light 26 signal is present at the infrared hot electron transistor, a photovoltage at A will appear and will be amplified by non-inverting constant gain multiplier 38. It should be appreciated that the embodiment illustrated in FIG. 3 permits the output photovoltage to be DC coupled to the high gain operational amplifier 138. Additionally, the sensitivity of the photoconductor between the emitter 112 and the collector 116 depends only on the emitter voltage supply 120. Therefore, the collector voltage supply 122 can be adjusted without decreasing the infrared light sensitivity of the circuit of the present invention.

From the above, it should readily be appreciated that the circuits of the present invention provide many advantages and benefits while reducing the complexity of circuits used to detect infrared radiation.

Although the preferred embodiment has been illustrated and described, it will be obvious to those skilled in the art that various modifications may be made without departing from the spirit and scope of this invention.

What is claimed is:

1. An infrared detection circuit comprising:
   an infrared hot electron transistor having an emitter, base, and collector, the base being common;
   an emitter voltage supply connected between the emitter and the base;
   a collector voltage supply connected between the collector and the base; and
   a load connected between the collector and said collector supply voltage,
   wherein an amplified output voltage is obtained when infrared radiation is detected by said infrared hot electron transistor and wherein:

$$\frac{R_L}{r} > \left( \frac{1}{\alpha} - 1 \right)$$

wherein,
$R_L$ = the value of said load,
$r$ = the value of the internal resistance between the emitter and the base, and α=the value of said infrared hot electron transistor photocurrent transfer ratio.

2. An infrared detection circuit comprising:

an infrared hot electron transistor having an emitter, base, and collector, the base being common;

an emitter voltage supply connector between the emitter and the base;

a collector voltage supply connected between the collector and the base;

a load connected between the collector and said collector voltage supply; and a non-inverting constant gain multiplier coupled between the collector and the base of said infrared hot electron transistor, wherein the photovoltage is amplified.

3. An infrared detection circuit as in claim 2 wherein:
said non-inverting constant gain multiplier is DC coupled.

4. An infrared detection circuit as in claim 2 wherein:
said non-inverting constant gain multiplier includes an operational amplifier.

* * * * *